(12) United States Patent
Yamamoto

(10) Patent No.: US 7,715,263 B2
(45) Date of Patent: May 11, 2010

(54) SEMICONDUCTOR MEMORY DEVICE

(75) Inventor: Koki Yamamoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 119 days.

(21) Appl. No.: 12/216,272

(22) Filed: Jul. 2, 2008

(65) Prior Publication Data
US 2009/0009235 A1 Jan. 8, 2009

(30) Foreign Application Priority Data
Jul. 5, 2007 (JP) ............................. P2007-177300

(51) Int. Cl.
*G11C 7/04* (2006.01)
(52) U.S. Cl. .................... 365/211; 365/212; 365/189.09
(58) Field of Classification Search ............ 365/189.09, 365/226, 211, 210.11, 210.12; 327/536, 327/539, 512
See application file for complete search history.

(56) References Cited
U.S. PATENT DOCUMENTS
6,531,911 B1 *  3/2003  Hsu et al. ................... 327/512
6,876,250 B2 *  4/2005  Hsu et al. ................... 327/539
7,630,265 B2 * 12/2009  Macerola et al. ............ 365/211

FOREIGN PATENT DOCUMENTS
JP        05-056559      3/1993
JP        2003-085971 A  3/2003

* cited by examiner

*Primary Examiner*—Gene N. Auduong
(74) *Attorney, Agent, or Firm*—Foley & Lardner LLP

(57) ABSTRACT

A semiconductor memory device includes a memory cell array and a voltage generation circuit for generating a voltage applied to the memory cell array, in which a plurality of drive MOS transistors having different width dimensions are selectively connected in parallel between an output line and the ground. The voltage is adjusted in response to the surrounding temperature in such a way that a prescribed number of drive MOS transistors selected from among the plurality of MOS transistors are normally and simultaneously driven. Thus, it is possible to precisely adjust the voltage in units of adjustment corresponding to differences of width dimensions without degrading the performance of the semiconductor memory device in a low current consumption mode.

3 Claims, 9 Drawing Sheets

FIG. 4

| | WIDTH DIMENSIONS OF TRANSISTORS [μm] | DIFFERENCE [μm] | | WIDTH DIMENSIONS OF TRANSISTORS [μm] | DIFFERENCE [μm] | | WIDTH DIMENSIONS OF TRANSISTORS [μm] | DIFFERENCE [μm] |
|---|---|---|---|---|---|---|---|---|
| T101 | 1 | — | T109 | 1 | — | T117 | 1 | — |
| T102 | 1.2 | 0.2 | T110 | 2.6 | 1.6 | T118 | 13.8 | 12.8 |
| T103 | 1.4 | 0.4 | T111 | 4.2 | 3.2 | T119 | 26.6 | 25.6 |
| T104 | 1.6 | 0.6 | T112 | 5.8 | 4.8 | T120 | 39.4 | 38.4 |
| T105 | 1.8 | 0.8 | T113 | 7.4 | 6.4 | T121 | 52.2 | 51.2 |
| T106 | 2 | 1 | T114 | 9 | 8 | T122 | 65 | 64 |
| T107 | 2.2 | 1.2 | T115 | 10.6 | 9.6 | T123 | 77.8 | 76.8 |
| T108 | 2.4 | 1.4 | T116 | 12.2 | 11.2 | T124 | 90.6 | 89.6 |

FIG. 8A

| DRIVE TRANSISTOR SELECTOR | CONTROL SIGNALS, SELECT SIGNALS | |
|---|---|---|
| 201 | C1 | =C001 |
| | C2 | =C002 |
| | C3 | =C003 |
| | SEL1 | =SEL01 |
| | SEL2 | =SEL02 |
| | SEL3 | =SEL03 |
| | SEL4 | =SEL04 |
| | SEL5 | =SEL05 |
| | SEL6 | =SEL06 |
| | SEL7 | =SEL07 |
| | SEL8 | =SEL08 |
| 202 | C1 | =C004 |
| | C2 | =C005 |
| | C3 | =C006 |
| | SEL1 | =SEL09 |
| | SEL2 | =SEL10 |
| | SEL3 | =SEL11 |
| | SEL4 | =SEL12 |
| | SEL5 | =SEL13 |
| | SEL6 | =SEL14 |
| | SEL7 | =SEL15 |
| | SEL8 | =SEL16 |
| 203 | C1 | =C007 |
| | C2 | =C008 |
| | C3 | =C009 |
| | SEL1 | =SEL17 |
| | SEL2 | =SEL18 |
| | SEL3 | =SEL19 |
| | SEL4 | =SEL20 |
| | SEL5 | =SEL21 |
| | SEL6 | =SEL22 |
| | SEL7 | =SEL23 |
| | SEL8 | =SEL24 |

FIG. 8B

| DRIVE TRANSISTOR SELECTOR | CONTROL SIGNALS, SELECT SIGNALS | |
|---|---|---|
| 301 | C1 | =C001 |
|  | C2 | =C002 |
|  | C3 | =C003 |
|  | SEL1 | =SEL01 |
|  | SEL2 | =SEL02 |
|  | SEL3 | =SEL03 |
|  | SEL4 | =SEL04 |
|  | SEL5 | =SEL05 |
|  | SEL6 | =SEL06 |
|  | SEL7 | =SEL07 |
|  | SEL8 | =SEL08 |
|  | E1 | =E011 |
| 303 | C1 | =C007 |
|  | C2 | =C008 |
|  | C3 | =C009 |
|  | SEL1 | =SEL17 |
|  | SEL2 | =SEL18 |
|  | SEL3 | =SEL19 |
|  | SEL4 | =SEL20 |
|  | SEL5 | =SEL21 |
|  | SEL6 | =SEL22 |
|  | SEL7 | =SEL23 |
|  | SEL8 | =SEL24 |
|  | E1 | =E012 |

SEMICONDUCTOR MEMORY DEVICE

BACKGROUND OF THE INVENTION

1. Field of the Invention

The present invention relates to semiconductor devices such as dynamic random-access memories, which have functions that adjust the levels of internal voltage sources.

The present application claims priority on Japanese Patent Application No. 2007-177300, the content of which is incorporated herein by reference.

2. Description of the Related Art

Recently developed semiconductor memory devices such as dynamic random-access memories (DRAM) may operate based on levels of internal voltage sources thereof, which should be individually adjusted with respect to individual products.

Various types of semiconductor memory devices having functions that adjust the levels of internal voltage sources have been disclosed in various documents, such as Patent Document 1 and Patent Document 2.

Patent Document 1: Japanese Unexamined Patent Application Publication No. H05-56559

Patent Document 2: Japanese Unexamined Patent Application Publication No. 2003-85971

Patent Document 1 teaches a semiconductor device having a plurality of voltage generation circuits for generating different levels of voltages based on an externally supplied voltage, wherein one of multiple voltage generation circuits is selected based on the operational characteristics of logic gates.

Patent Document 2 teaches a semiconductor memory device, which selectively turns on multiple transistors connected in series so as to produce a desired voltage based on on-resistance thereof.

Various methods have been developed to adjust dimensions of drive transistors by way of current controls of voltage generation circuits incorporated in conventionally-known semiconductor memory devices such as DRAM. One method is to change the dimensions of drive transistors. Another method is to additionally provide other drive transistors. In addition, various methods have been developed to finely adjust the dimensions of transistors. That is, one method is to change the dimensions of transistors. Another method is to additionally provide other transistors having very small dimensions. To achieve significant adjustment regarding the dimensions of transistors, it is necessary to additionally provide transistors whose dimensions are greater than those of transistors used in fine adjustment; alternatively, it is necessary to additionally provide numerous transistors (whose dimensions are identical to those of transistors used in fine adjustment), the number of which is far more than the number of transistors used in fine adjustment.

It is necessary for recently developed semiconductor memory devices such as DRAM to have low power consumption and high precision of dimensions because they must operate normally without interruption. In the aforementioned methods for additionally providing transistors having very small dimensions, in particular, in significant adjustment, it is necessary to perform a first step of additionally providing transistors whose dimensions are greater than those of transistors used in fine adjustment or a second step of additionally providing numerous transistors (whose dimensions are identical to those of transistors used in fine adjustment), the number of which is far more than the number of transistors used in fine adjustment. The difference between the first and second steps may degrade the partial precision of adjustment in prescribed processes, thus degrading the entire precision of adjustment.

The main factor in degrading the precision of adjustment is due to very small currents, which may not be affected by dimensions of drive transistors, within currents applied to drive transistors. Conventionally, they are very small and negligible; however, they have been recently highlighted as a negative influence because of a reduction of currents of adjustment circuits. They may be easily varied in manufacturing processes; hence, the conventional technology suffers from a problem in that it is difficult to secure an adequate precision of operation in semiconductor memory devices using adjustment circuits designed based on pre-estimated currents flowing therethrough.

SUMMARY OF THE INVENTION

It is an object of the present invention to provide semiconductor memory devices having functions of adjusting the levels of voltages with a high precision without substantially adjusting the levels of a voltage generation circuit, thus preventing the performance thereof from being degraded in a low current consumption mode.

A semiconductor memory device of the present invention includes a memory cell array, and a voltage generation circuit for generating a voltage applied to the memory cell array, in which a plurality of drive MOS transistors having different width dimensions are selectively connected in parallel between an output line for outputting the voltage and the ground. The voltage is adjusted in response to the surrounding temperature in such a way that a prescribed number of drive MOS transistors selected from among the plurality of MOS transistors are normally and simultaneously driven.

Specifically, the voltage generation circuit includes a temperature sensor for detecting the surrounding temperature, a voltage generator for generating the voltage to be applied to the memory cell array, a control circuit for outputting a control signal based on the output of the temperature sensor, and a voltage adjustment circuit for adjusting the voltage generated by the voltage generator based on the control signal. Herein, the voltage adjustment circuit includes a plurality of drive MOS transistors having different width dimensions which are selectively connected in parallel between the output line and the ground. In addition, the control circuit controls the voltage adjustment circuit based on the control signal such that a prescribed number of drive MOS transistors selected from among the plurality of drive NMOS transistors are normally and simultaneously driven.

In this connection, the voltage adjustment circuit includes a plurality of drive transistor selectors, each of which selectively drives one of the drive MOS transistors connected thereto.

During the operating state of the voltage adjustment circuit, normally the prescribed number of drive MOS transistors is simultaneously connected between the output line and the ground. Since substantially no variation occurs in very small current components not affected by width dimensions of drive MOS transistors, it is possible to precisely adjust the voltage in units of adjustment corresponding to differences of width dimensions.

BRIEF DESCRIPTION OF THE DRAWINGS

These and other objects, aspects, and embodiments of the present invention will be described in more detail with reference to the following drawings, in which:

FIG. 4 shows the relationship between twenty-four drive NMOS transistors included in the voltage adjustment circuit in terms of width dimensions;

FIG. 8A shows the relationship between drive transistor selectors 201, 202, and 203 in connection with control signals and select signals; and FIG. 8B shows the relationship between drive transistor selectors 301 and 303 in connection with control signals, circuit control signals, and select signals.

DESCRIPTION OF THE PREFERRED EMBODIMENT

The present invention will be described in further detail by way of examples with reference to the accompanying drawings.

Figure 1:
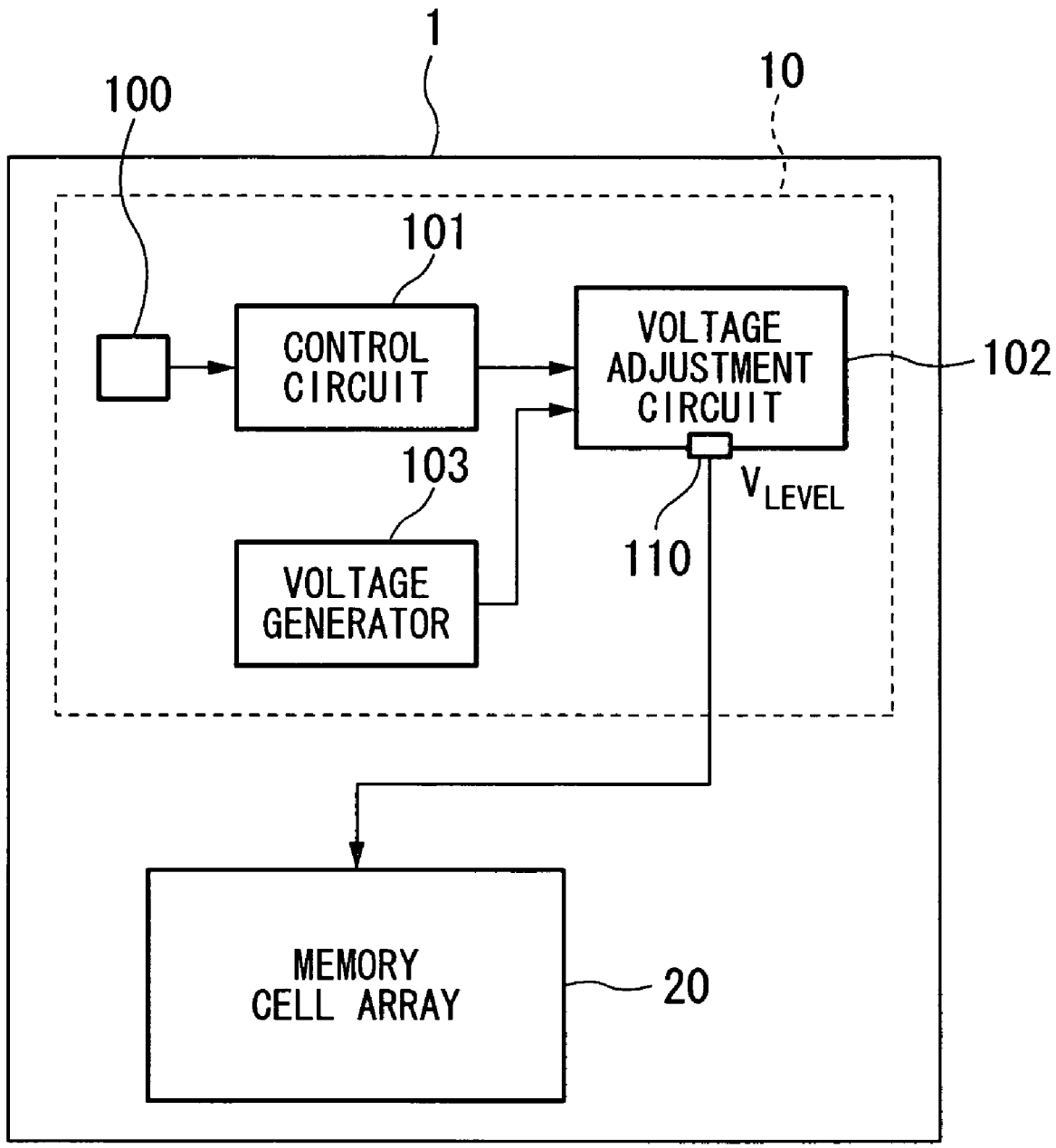
FIG. 1 is a block diagram showing the constitution of a semiconductor memory device in accordance with a preferred embodiment of the present invention.

FIG. 1 shows a semiconductor memory device 1 in accordance with a preferred embodiment of the present invention. The semiconductor memory device 1 includes a temperature sensor 100, a control circuit 101, a voltage adjustment circuit 102, a voltage generator 103, and a memory cell array 20.

That is, the temperature sensor 100, the control circuit 101, the voltage adjustment circuit 102, and the voltage generator 103 form a voltage generation circuit 10 that generates a prescribed level of voltage (referred to as a voltage $V_{LEVEL}$) applied to the memory cell array 20.

The temperature sensor 100 detects the temperature in the surrounding area of the semiconductor memory device 1. The voltage generator 103 generates the voltage $V_{LEVEL}$, which is supplied to the memory cell array 20.

The control circuit 100 outputs a control signal for correcting the voltage $V_{LEVEL}$ (output from the voltage generator 103) based on the detection result of the temperature sensor 100. That is, the control circuit 101 outputs the control signal designating variations of the voltage $V_{LEVEL}$ due to variations of the surrounding temperature.

The voltage adjustment circuit 102 adjusts the voltage $V_{LEVEL}$ based on the control signal of the control circuit 101.

The detailed constitution of the voltage adjustment circuit 102 will be described later, wherein it includes a plurality of drive MOS transistors (having different dimensions) that are connected in parallel between an output line XL (receiving the voltage $V_{LEVEL}$) and the ground.

The control circuit 101 controls the voltage adjustment circuit 102 such that substantially the same number of drive MOS transistors are normally driven within all drive MOS transistors (included in the voltage adjustment circuit 102) in a voltage adjustment mode.

Figure 2:
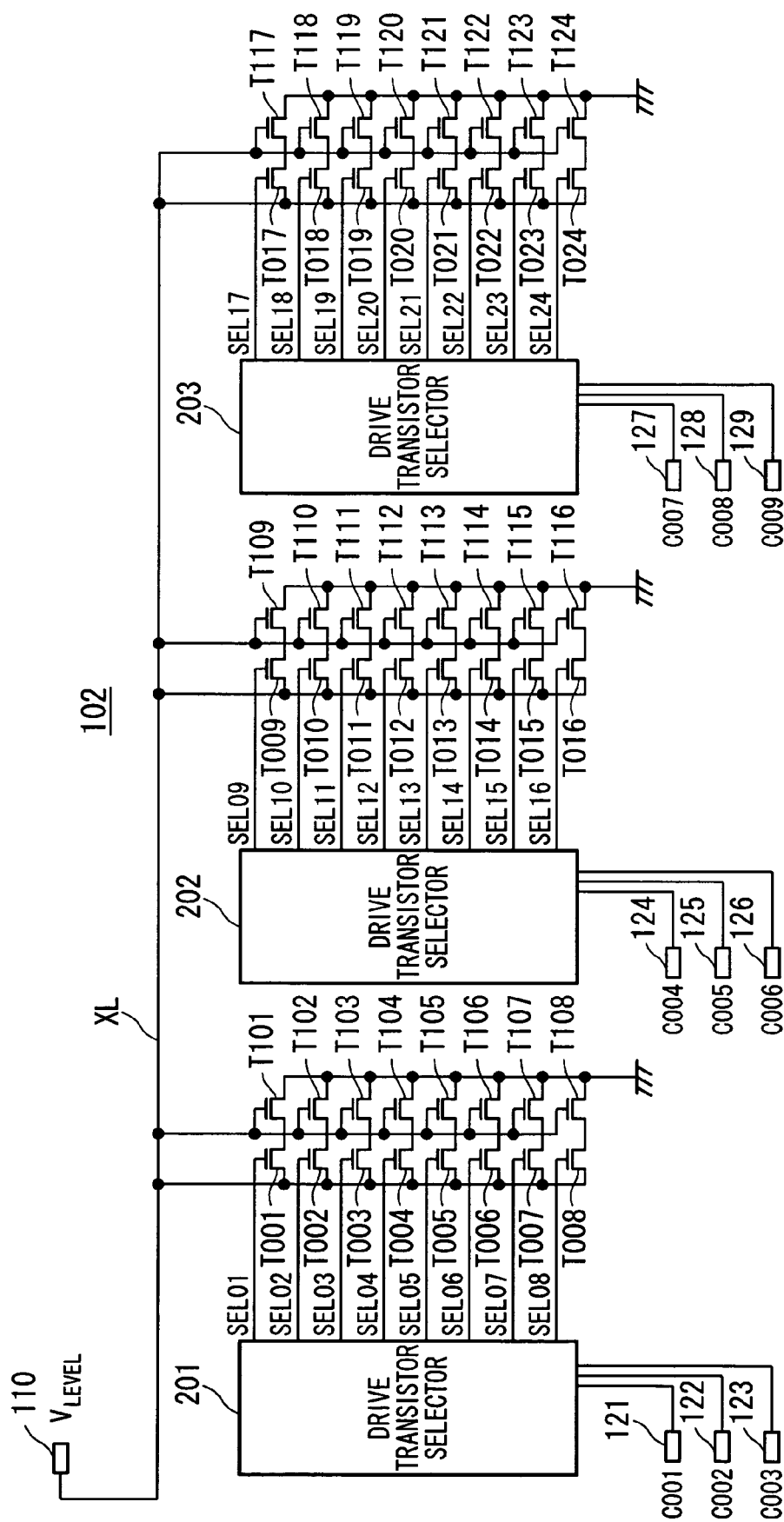
FIG. 2 is a diagram showing the detailed constitution of a voltage adjustment circuit included in the semiconductor memory device shown in FIG. 1.

FIG. 2 shows the detailed constitution of the voltage adjustment circuit 102 shown in FIG. 1. The voltage adjustment circuit 102 is constituted of drive transistor selectors 201, 202, and 203 as well as select NMOS transistors T001 to T024 and drive NMOS transistors T101 to T124 (whose dimensions differ from the dimensions of the select NMOS transistors T001 to T024).

The voltage generator 103 generates the voltage $V_{LEVEL}$, which is supplied onto the output line XL connected to a terminal 110. The drive NMOS transistors T101 to T124 are connected in parallel via the select NMOS transistors T001 to T024 between the output line XL and the ground. The voltage adjustment circuit 102 includes control terminals 121 to 129, which receive control signals C001 to C009 output from the control circuit 101 shown in FIG. 1.

The drive transistor selector 201 outputs select signals SEL01 to SEL08 to the gates of the select NMOS transistors T001 to T008, which are thus selectively turned on or off, wherein the drains of the select NMOS transistors T001 to T008 are connected together with the output line XL. The sources of the select NMOS transistors T001 to T008 are connected to the drains of the drive NMOS transistors T101 to T108, the sources of which are connected together and grounded. The gates of the drive NMOS transistors T101 to T108 are connected together with the output line XL.

The drive transistor selector 201 selectively outputs one of the select signals SEL01 to SEL08 based on a 3-bit control signal (consisted of C001, C002, and C003 applied to the control terminals 121, 122, and 123) output from the control circuit 101.

Similarly, the drive transistor selector 202 outputs select signals SEL09 to SEL16 to the gates of the select NMOS transistors T009 to T016, which are thus selectively turned on or off, wherein the drains of the select NMOS transistors T009 to T016 are connected together with the output line XL. The sources of the select NMOS transistors T009 to T016 are connected to the drains of the drive NMOS transistors T109 to T116, the sources of which are connected together and grounded. The gates of the drive NMOS transistors T109 to T116 are connected together with the output line XL.

The drive transistor selector 202 selectively outputs one of the select signals SEL09 to SEL16 based on a 3-bit control signal (consisted of C004, C005, and C006 applied to the control terminals 124, 125, and 126) output from the control circuit 101.

Furthermore, the drive transistor selector 203 outputs select signals SEL17 to SEL24 to the gates of the select NMOS transistors T017 to T024, which are thus selectively turned on or off, wherein the drains of the select NMOS transistors T017 to T024 are connected together with the output line XL. The sources of the select NMOS transistors T017 to T024 are connected to the drains of the drive NMOS transistors T117 to T124, the sources of which are connected together and grounded. The gates of the drive NMOS transistors T117 to T124 are connected together with the output line XL.

The drive transistor selector 203 selectively outputs one of the select signals SEL17 to SEL24 based on a 3-bit control signal (consisted of C007, C008, and C009 applied to the control terminals 127, 128, and 129) output from the control circuit 101.

Next, the detailed constitution of the drive transistor selectors 201, 202, and 203 will be described with reference to FIG. 3, which shows only the detailed constitution of the drive transistor selector 201 because all the drive transistor selectors 201 to 203 have substantially the same constitution.

Figure 3:
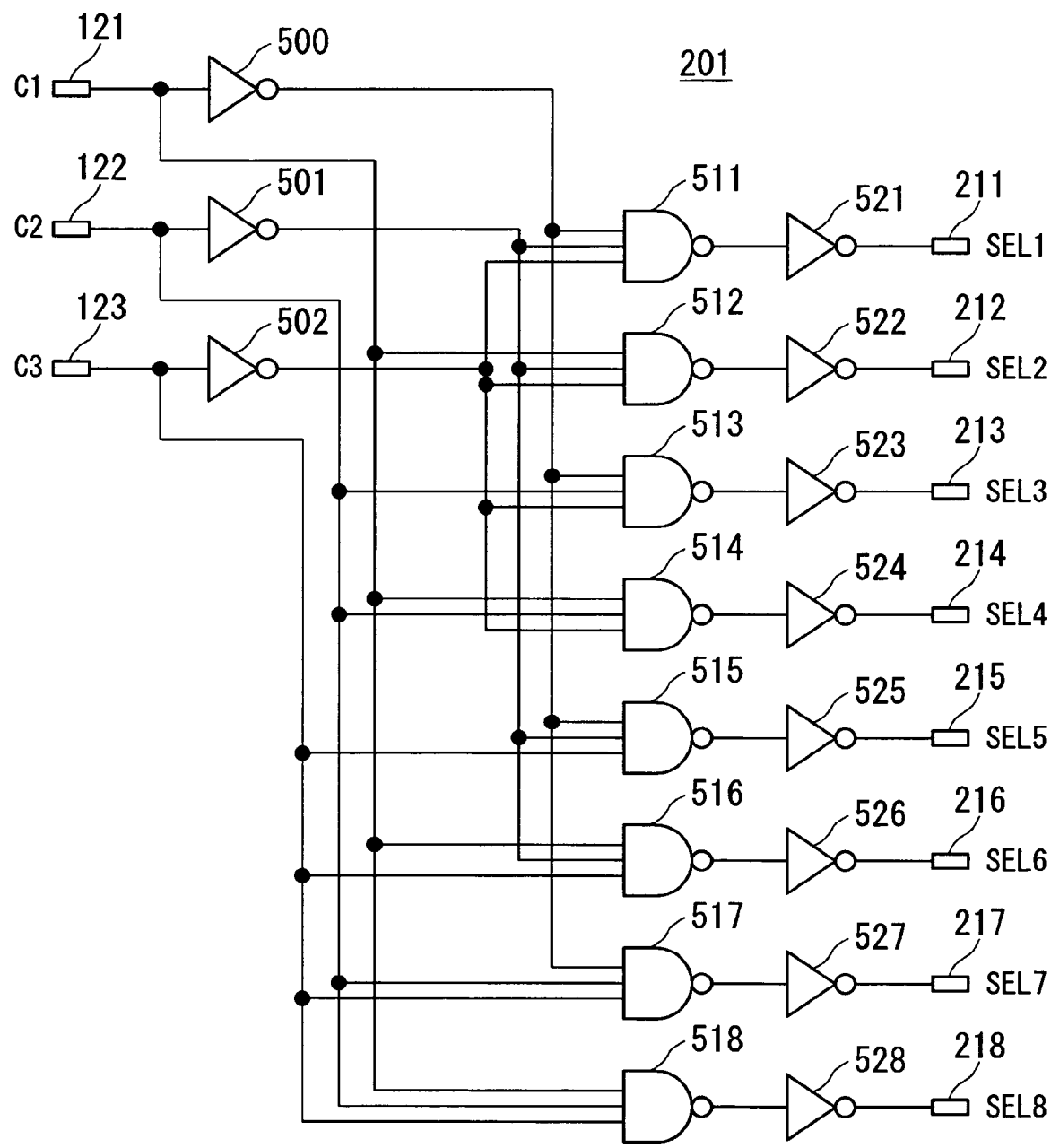
FIG. 3 is a circuit diagram showing the detailed constitution of a drive transistor selector included in the voltage adjustment circuit.

The drive transistor selector 201 of FIG. 3 includes inverters 500, 501, and 502 (whose input terminals are connected to the control terminals 121, 122, and 123 receiving control signals C1, C2, and C3 (i.e. C001, C002, and C003), NAND gates 511 to 518 (whose input terminals are connected to the output terminals of the inverters 500 to 502 and the input terminals 121 to 123, respectively), inverters 521 to 528 (whose input terminals are connected to the output terminals of the NAND gates 511 to 518), and output terminals 211 to 218, which are connected to the output terminals of the inverters 521 to 528 so as to output the select signals SEL01 to SEL08.

Specifically, the NAND gate 511 performs a NAND operation on the output signals of the inverters 500 to 502. The NAND gate 512 performs a NAND operation on the control signal C1 and the output signals of the inverters 501 and 502. The NAND gate 513 performs a NAND operation on the control signal C2 and the output signals of the inverters 500 and 502. The NAND gate 514 performs a NAND operation on the control signals C1 and C2 and the output signal of the inverter 502. The NAND gate 515 performs a NAND operation on the output signals of the inverters 500 and 501 and the control signal C3. The NAND gate 516 performs a NAND operation on the output signal of the inverter 501 and the control signals C1 and C3. The NAND gate 517 performs a NAND operation on the output signal of the inverter 500 and the control signals C2 and C3. The NAND gate 518 performs a NAND operation on the control signals C1, C2, and C3. The output signals of the NAND gates 511 to 518 are supplied to the inverters 521 to 528.

Based on a three-bit control signal (consisted of C1, C2, and C3, in which C1 forms a highest order bit, C2 forms a next order bit, and C3 forms a lowest order bit) output from the control circuit 101 and received at the control terminals 121 to 123, the drive transistor selector 201 selectively outputs one of select signals SEL1 to SEL8 (i.e. SEL01 to SEL08) via the output terminals 211 to 218.

The drive transistor selectors 202 and 203 are each configured similarly to the drive transistor selector 201. That is, the drive transistor selector 202 receives the control signals C004 to C006 at the control terminals 124 to 126 so as to selectively output one of the select signals SEL09 to SEL16. The drive transistor selector 203 receives the control signals C007 to C009 at the control terminals 127 to 129 so as to selectively output one of the select signals SEL17 to SEL24.

FIG. 4 shows the width dimensions and differences therebetween (in units of micrometers ($\mu$m)) with respect to the drive NMOS transistors T101 to T124, which are selectively switched over under the control of the drive transistor selectors 201 to 203 in the voltage adjustment circuit 102.

During the operating state of the voltage adjustment circuit 102 shown in FIG. 2, the drive transistor selectors 201 to 203 operate based on 3-bit control signals output from the control circuit 101 and received at the control terminals 121 to 129, thus selectively outputting the select signals SEL01 to SEL24. Thus, normally three drive NMOS transistors are selected and connected between the output line XL (receiving the voltage $V_{LEVEL}$) and the ground.

Next, the switching operation of the voltage adjustment circuit 102 for changing the voltage $V_{LEVEL}$ applied to the output line XL by switching over drive NMOS transistors will be described in detail. An initial state (before the switch operation) is presumed in such a way that the drive transistor selectors 201, 202, and 203 selectively output the select signals SEL01, SEL09, and SEL17 so as to selectively drive the drive NMOS transistors T101, T109, and T117, which are thus connected between the output line XL and the ground.

Due to variations of the surrounding temperature, the voltage VLEVEL output from the voltage adjustment circuit 102 varies so that the voltage VLEVEL applied to the output line XL is adjusted based on control signals output from the control circuit 101. For example, it is possible to increase the drive capabilities of drive NMOS transistors by a prescribed value corresponding to a 10.2 $\mu$m in the width dimension, thus reducing the voltage VLEVEL. In this case, the control circuit 101 supplies 3-bit control signals (i.e. C001-C003 and C004-C006) to the control terminals 121-123 and 124-126 so as to change the select signal SEL01 to the select signal SEL04 and to change the select signal SEL09 to the select signal SEL15.

When the select signal SEL01 is changed to the select signal SEL04, the drive NMOS transistor T101 is changed to the drive NMOS transistor T104. When the select signal SEL09 is changed to the select signal SEL15, the drive NMOS transistor T109 is changed to the drive NMOS transistor T115. Thus, instead of the drive NMOS transistors T101 and T109, the drive NMOS transistors T104 and T115 are connected between the output line XL and the ground. The difference in the width dimensions between the drive NMOS transistors T101 and T104 is 0.6 $\mu$m, while the difference in the width dimensions between the drive NMOS transistors T109 and T115 is 9.6 $\mu$m; hence, the total of the width dimensions is 10.2 $\mu$m. Thus, it is possible to increase the sum of the width dimensions by 10.2 $\mu$m by appropriately switching drive NMOS transistors.

To achieve the switch operation between drive NMOS transistors connected to the output line XL applied with the voltage $V_{LEVEL}$, all the drive NMOS transistors T101 to T124 have substantially the same shape and dimensions, except for the width dimensions. This makes it possible to neglect very small parasite current components, which do not depend upon width dimensions of transistors. In addition, all the select NMOS transistors T001 to T024 should have substantially the same shape and dimensions, except for the width dimensions, so that they can be appropriately arranged together with the drive NMOS transistors T101 to T124 in the voltage adjustment circuit 102.

In the present embodiment in which the drive NMOS transistors T101 to T124 have individual values of width dimensions as shown in FIG. 4, it is possible for the voltage adjustment circuit 102 to adjust the voltage $V_{LEVEL}$ by appropriate values in units of 0.2 $\mu$m within the range of width dimensions between 0.0 $\mu$m and 102.2 $\mu$m without dispersions.

Figure 5:
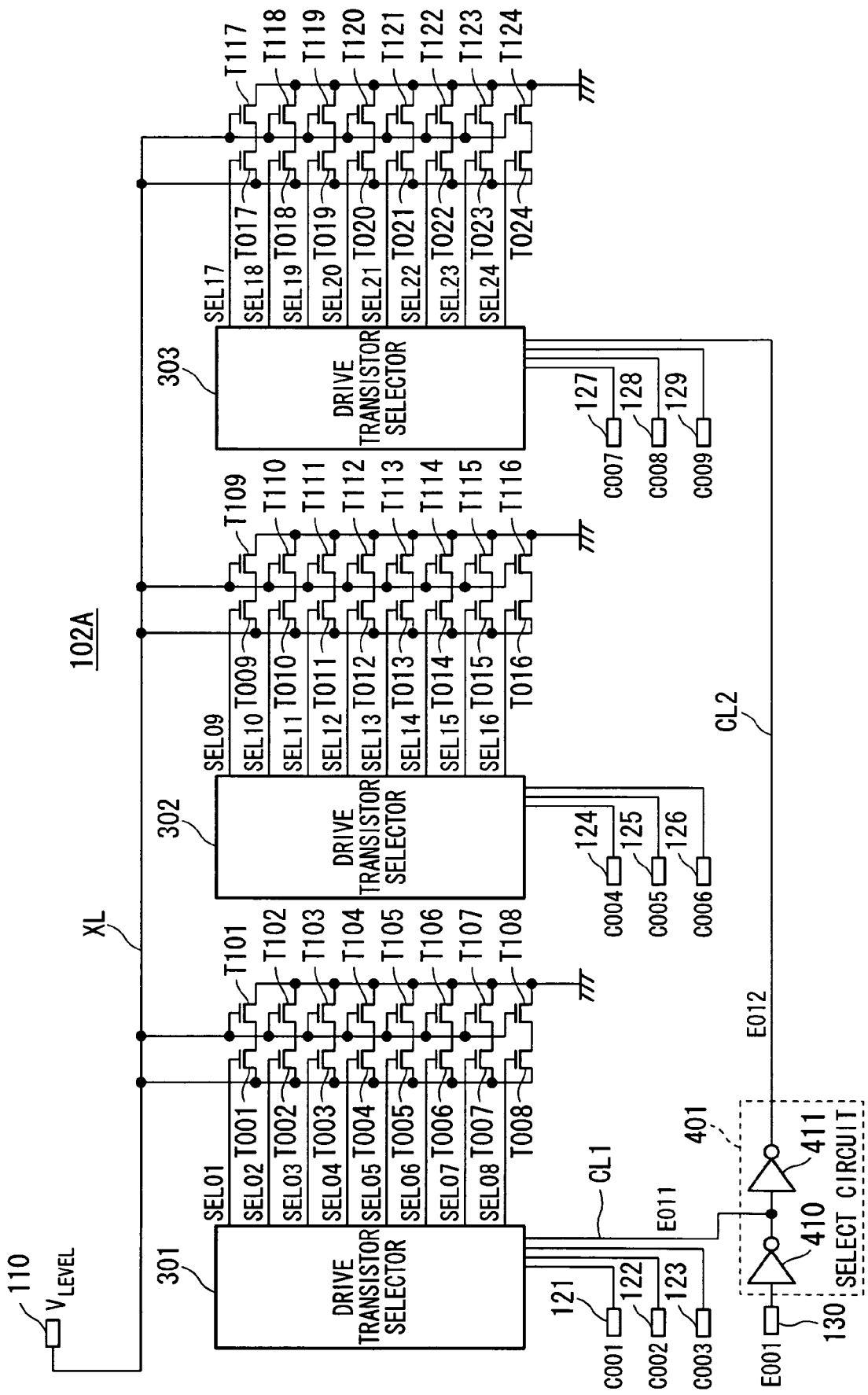
FIG. 5 is a diagram showing the detailed constitution of a first variation of the voltage adjustment circuit.

In the present embodiment, the voltage adjustment circuit 102 can be modified in a variety of ways. FIG. 5 shows a voltage adjustment circuit 102A, in which parts identical to those shown FIG. 2 are designated by the same reference numerals. The voltage adjustment circuit 102A includes drive transistor selectors 301, 302, and 303 (instead of the drive transistor selectors 201 to 203 shown in FIG. 2) as well as the select NMOS transistors T001 to T024 and the drive NMOS transistors T101 to T124 (having different width dimensions).

In the voltage adjustment circuit 102A of FIG. 5, the drive NMOS transistors T101 to T124 are connected in parallel via the select NMOS transistors T001 to T024 between the output line XL (connected to the terminal 110 receiving the voltage VLEVEL output from the voltage generator 103) and the ground. Similar to the voltage adjustment circuit 102, the voltage adjustment circuit 102A has the control terminals 121 to 129 for receiving the control signals C001 to C009 output from the control circuit 101.

The voltage adjustment circuit 102A further includes a select circuit 401 that selectively activates the drive transistor selectors 301 and 303, wherein the drive transistor selector 302 operates similarly to the drive transistor selector 202 shown in FIG. 2. The select circuit 401 includes two inverters 410 and 411, which operate based on a circuit select signal E001 received at an input terminal 130. The inverter 410 inverts the logic level of the circuit select signal E001 so as to output a circuit select signal E011. The inverter 411 inverts the logic level of the circuit select signal E011 (output from the inverter 410) so as to output a circuit select signal E012.

The circuit select signal E011 output from the select circuit 401 is supplied to the drive transistor selector 301 via a control line CL1. The circuit select signal E012 output from the select circuit 401 is supplied to the drive transistor selector 303 via a control line CL2.

In a high-level period of the circuit select signal E011, the drive transistor selector 301 is activated so as to selectively output one of the select signals SEL01 to SEL08 based on the three-bit control signal (consisted of C001, C002, and C003 received at the control terminals 121, 122, and 123). In a high-level period of the circuit select signal E012, the drive transistor selector 303 is activated so as to selectively output one of the select signals SEL17 to SEL24 based on the 3-bit control signal (consisted of C007, C008, and C009 received at the control terminals 127, 128, and 129).

Similar to the drive transistor selector 202, the drive transistor selector 302 normally operates based on the 3-bit control signal (consisted of C004, C005, and C006 received at the control terminals 124, 125, and 126), thus selectively outputting one of the select signals SEL09 to SEL16.

In a low-level period of the circuit select signal E001 received at the input terminal 130, both the drive transistor selectors 301 and 302 are activated. In a high-level period of the circuit select signal E001, both the drive transistor selectors 302 and 303 are activated. That is, during the operating state of the voltage adjustment circuit 102, normally two drive NMOS transistors are connected between the output line XL and the ground.

Both the drive transistor selectors 301 and 303 included in the voltage adjustment circuit 102 of FIG. 5 have substantially the same constitution; hence, the detailed constitution of the drive transistor selector 301 will be described with reference to FIG. 6, in which parts identical to those shown in FIG. 3 are designated by the same reference numerals.

Figure 6:
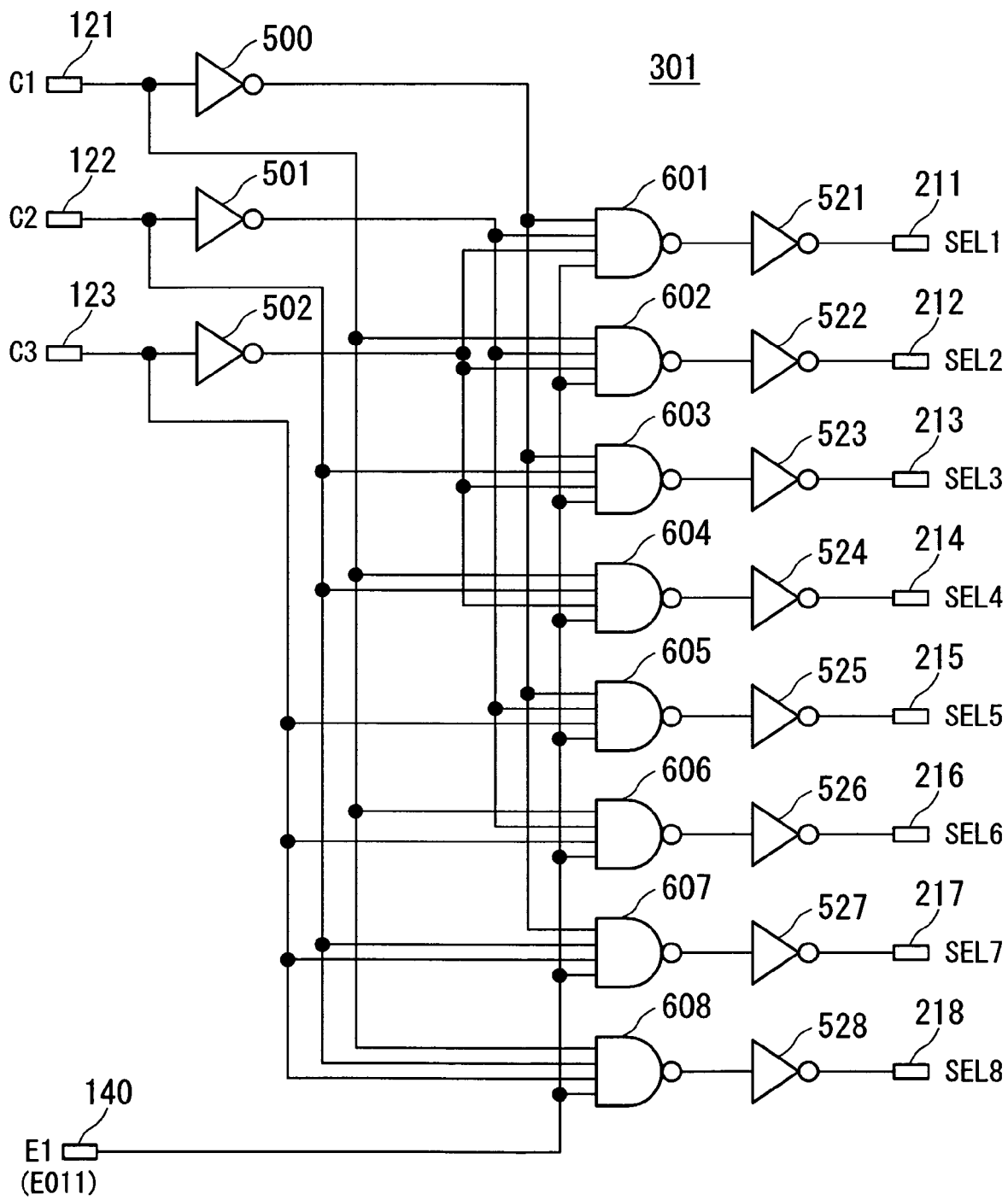
FIG. 6 is a circuit diagram showing the detailed constitution of a drive transistor selector included in the voltage adjustment circuit shown in FIG. 5.

Compared with the drive transistor selector 201 of FIG. 3, the drive transistor selector 301 of FIG. 6 is characterized in that the 3-input NAND gates 511 to 518 are replaced with 4-input NAND gates 601 to 608, each of which receives the circuit select signal E011 (received at a terminal 140). Other constituent elements of the drive transistor selector 301 are substantially identical to those of the drive transistor selector 201; hence, the descriptions thereof will be omitted. The detailed constitution of the drive transistor selector 303 is substantially identical to that of the drive transistor selector 301 except that, in the drive transistor selector 303, each of the 4-input NAND gates 601 to 608 receives the circuit select signal E012 instead of the circuit select signal E011.

As shown in FIGS. 5 and 6, normally two drive NMOS transistors are connected between the output line XL and the ground during the operating state of the voltage adjustment circuit 102A. When the drive transistor selectors 301 and 302 experience a shortage of the sum of voltage adjustment values (substantially equivalent to the sum of the width dimensions of transistors), the voltage adjustment circuit 102A is capable of increasing the voltage adjustment range by way of controlling the circuit select signal E001.

Figure 7:
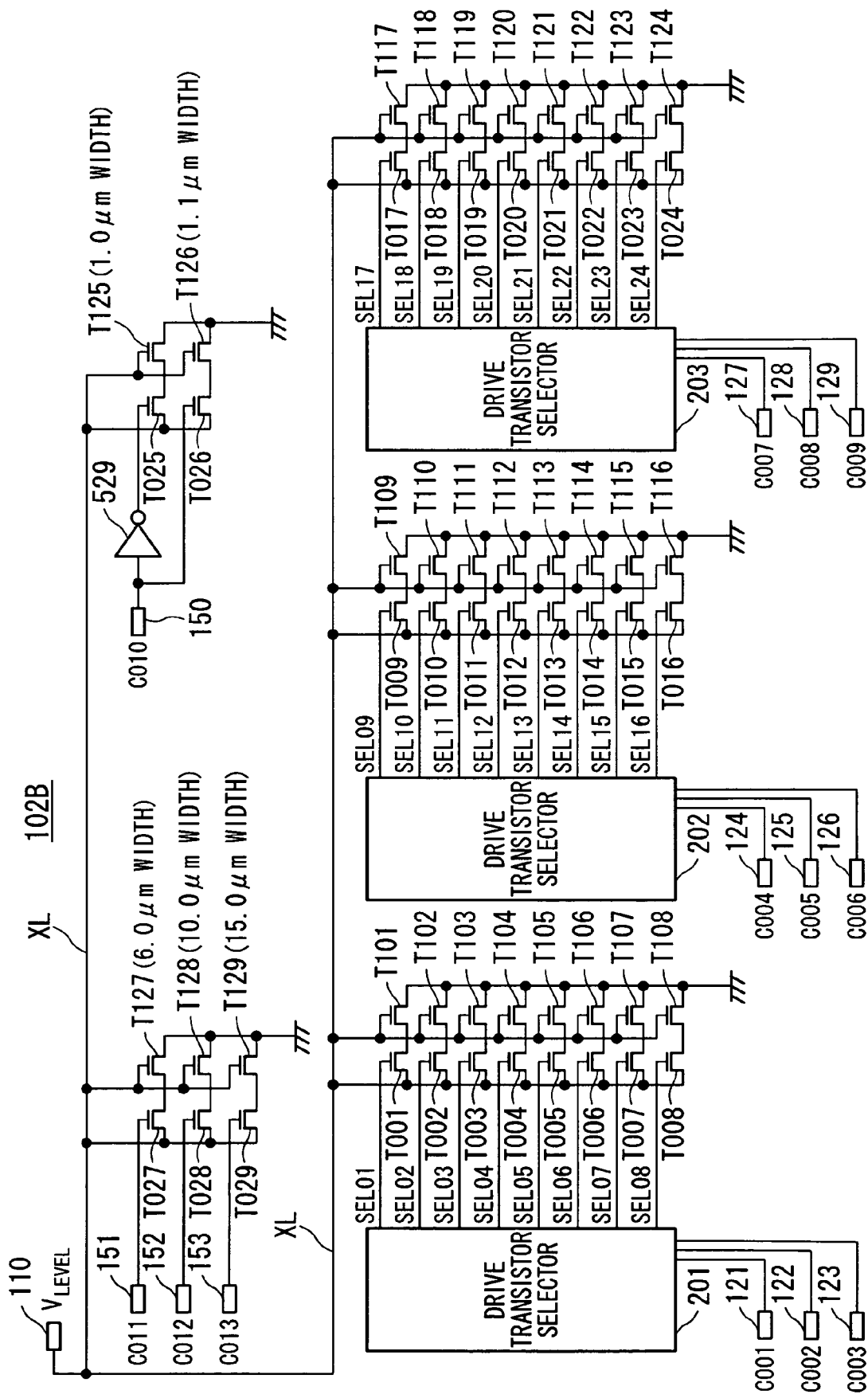
FIG. 7 is a diagram showing the detailed constitution of a second variation of the voltage adjustment circuit.

Next, another variation will be described with respect to a voltage adjustment circuit 102B with reference to FIG. 7.

The detailed constitution of the voltage adjustment circuit 102B is substantially identical to that of the voltage adjustment circuit 102, except for drive NMOS transistors T125 to T129 coupled with select NMOS transistors T025 to T029, which are additionally arranged in connection with the output line XL. The drive NMOS transistors T125 and T126 are used to increase the precision of adjustment by further reducing the units of adjustment that are achieved by the drive NMOS transistors T101 to T124. The drive NMOS transistors T127 to T129 are used to temporarily and substantially change the capability of adjustment. Other constituent elements of the voltage adjustment circuit 120B are identical to those of the voltage adjustment circuit 102.

Specifically, the voltage adjustment circuit 102B includes the drive transistor selectors 201 to 203, the select NMOS transistors T001 to T029, and the drive NMOS transistors T101 to T129 (having different width dimensions). Prescribed width dimensions are set to the newly added drive NMOS transistors T125 to T129 such that T125 is set to 1.0 µm, T126 is set to 1.1 µm, T127 is set to 5.0 µm, T128 is set to 10.0 µm, and T129 is set to 15.0 µm.

The drive NMOS transistors T101 to T129 are connected in parallel via the select NMOS transistors T001 to T029 between the output line XL (connected to the terminal 110 receiving the voltage $V_{LEVEL}$ from the voltage generator 103) and the ground. The voltage adjustment circuit 102B further includes control terminals 150 to 153 for receiving control signals C010 to C013 as well as the control terminals 121 to 129 for receiving the control signals C001 to C009.

By way of an inverter 529 receiving the control signal C010, one of the drive NMOS transistors T125 and T126 is selected based on the control signal C010. One of the drive NMOS transistors T127, T128, and T129 is selected based on the control signals C011, C012, and C013.

That is, during the operating state of the voltage adjustment circuit 102B, normally five drive NMOS transistors are connected between the output line XL and the ground.

FIGS. 8A and 8B show the relationships between the drive transistor selectors 201, 202, 203, 301, and 303 (in which the drive transistor selector 302 is identical to the drive transistor selector 202) in connection with the select signals SEL01 to SEL24, the control signals C001 to C009, and the circuit select signals E011 and E012.

As described heretofore, the semiconductor device 1 of the present embodiment is controlled in such a way that drive NMOS transistors having different dimensions are adequately selected and changed so as to change the capability thereof, wherein normally the prescribed number of drive NMOS transistors are connected between the output line XL (providing the voltage $V_{LEVEL}$ adjusted by the voltage adjustment circuit) and the ground. This substantially reduces variations of very small current components not affected by width dimensions of transistors; hence, it is possible to precisely achieve units of adjustment substantially corresponding to differences of width dimensions of drive NMOS transistors.

The semiconductor memory device 1 of the present invention can be applied to various types of battery-driven portable electronic devices (requiring low power consumption) such as portable telephones (or cellular phones) and portable media players.

Lastly, the present invention is not necessarily limited to the present embodiment, which can be further modified within the scope of the invention as defined in the appended claims.

What is claimed is:

1. A semiconductor memory device comprising:
a memory cell array; and
a voltage generation circuit for generating a voltage applied to the memory cell array, in which a plurality of drive MOS transistors having different width dimensions are selectively connected in parallel between an output line for outputting the voltage and a ground, wherein the voltage is adjusted in response to a surrounding temperature in such a way that a prescribed number of drive MOS transistors selected from among the plurality of MOS transistors are normally and simultaneously driven.

2. A semiconductor memory device comprising:

a memory cell array; and a voltage generation circuit for generating a voltage applied to the memory cell array, wherein the voltage generation circuit includes a temperature sensor for detecting a surrounding temperature, a voltage generator for generating the voltage to be applied to the memory cell array, a control circuit for outputting a control signal based on an output of the temperature sensor, and a voltage adjustment circuit for adjusting the voltage generated by the voltage generator based on the control signal, wherein the voltage adjustment circuit includes a plurality of drive MOS transistors having different width dimensions which are selectively connected in parallel between an output line for outputting the voltage and a ground, and wherein the control circuit controls the voltage adjustment circuit based on the control signal, such that a prescribed number of drive MOS transistors selected from among the plurality of drive NMOS transistors are normally and simultaneously driven.

3. A semiconductor memory device according to claim 2, wherein the voltage adjustment circuit includes a plurality of drive transistor selectors, each of which selectively drives one of the drive MOS transistors connected thereto.

* * * * *